United States Patent [19]
Letterman, Jr. et al.

[11] Patent Number: 5,785,791
[45] Date of Patent: Jul. 28, 1998

[54] METHOD OF MANUFACTURING SEMICONDUCTOR COMPONENT

[75] Inventors: James P. Letterman, Jr., Mesa; Reginald K. Asher, Sr., Scottsdale; Reginald K. Asher, II, Phoenix, all of Ariz.; Mohan Lal Sanduja, Flushing; Felicia B. Dragnea, Forest Hills, both of N.Y.

[73] Assignee: Motorola, Inc., Schaumburg, Ill.

[21] Appl. No.: 850,307

[22] Filed: May 5, 1997

[51] Int. Cl.⁶ .................. B32B 31/00; H01L 21/00
[52] U.S. Cl. .................. 156/242; 216/14; 438/106
[58] Field of Search .................. 438/106, 112, 438/126, 127; 156/242, 244.12, 244.26; 216/14, 33, 35; 257/666, 667, 678, 684

[56] References Cited
U.S. PATENT DOCUMENTS

| | | |
|---|---|---|
| 3,401,049 | 9/1968 | Horowitz . |
| 3,698,931 | 10/1972 | Horowitz . |
| 5,087,962 | 2/1992 | De Vos et al. . |
| 5,120,803 | 6/1992 | Kitahara et al. . |
| 5,309,027 | 5/1994 | Letterman, Jr. . |
| 5,328,552 | 7/1994 | Banzoni ........................... 216/14 |
| 5,483,740 | 1/1996 | Maslakow ..................... 216/14 X |

*Primary Examiner*—William Powell
*Attorney, Agent, or Firm*—George C. Chen

[57] ABSTRACT

A polymeric organic coating (24) used to package a semiconductor component (10) increases voltage isolation, decreases thermal resistance, and increases scratch and abrasion resistance for the semiconductor component (10). The coating (24) is applied to a leadframe (14) of the semiconductor component (10) using a chemical grafting process that involves the use of monomers, prepolymers, a catalyst, a graft initiator, and other ingredients. The coating (24) forms a polymeric organic film that is chemically bonded to the surfaces of the leadframe (14). The chemical grafting process produces a chemical bond, which improves adhesion between the coating (24) and the leadframe (14).

19 Claims, 1 Drawing Sheet

METHOD OF MANUFACTURING SEMICONDUCTOR COMPONENT

BACKGROUND OF THE INVENTION

This invention relates, in general, to semiconductor components, and more particularly, to packaged semiconductor components.

Conventional packages for discrete power semiconductor devices include the TO-220 and TO-264. These packages must meet stringent requirements for voltage isolation, thermal resistance, scratch resistance, abrasion resistance, and moisture resistance. However, as discrete power devices are used in higher voltage and current applications, the voltage isolation and thermal dissipation of the conventional packages must be improved.

Accordingly, a need exists for a semiconductor component that provides both high voltage isolation and high heat dissipation.

DETAILED DESCRIPTION OF THE DRAWINGS

During operation, most power devices generate heat, which must be dissipated. To dissipate the heat, a semiconductor component has a heatsink, which is thermally coupled to a semiconductor chip supporting the power device. The heatsink is then mounted onto a system board, which dissipates heat from the heatsink. In some packages, the heatsink is also electrically connected to the semiconductor chip. Therefore, electrical insulation of the heatsink is necessary to protect the power device from current or voltage spikes in the system environment.

Figure 1:
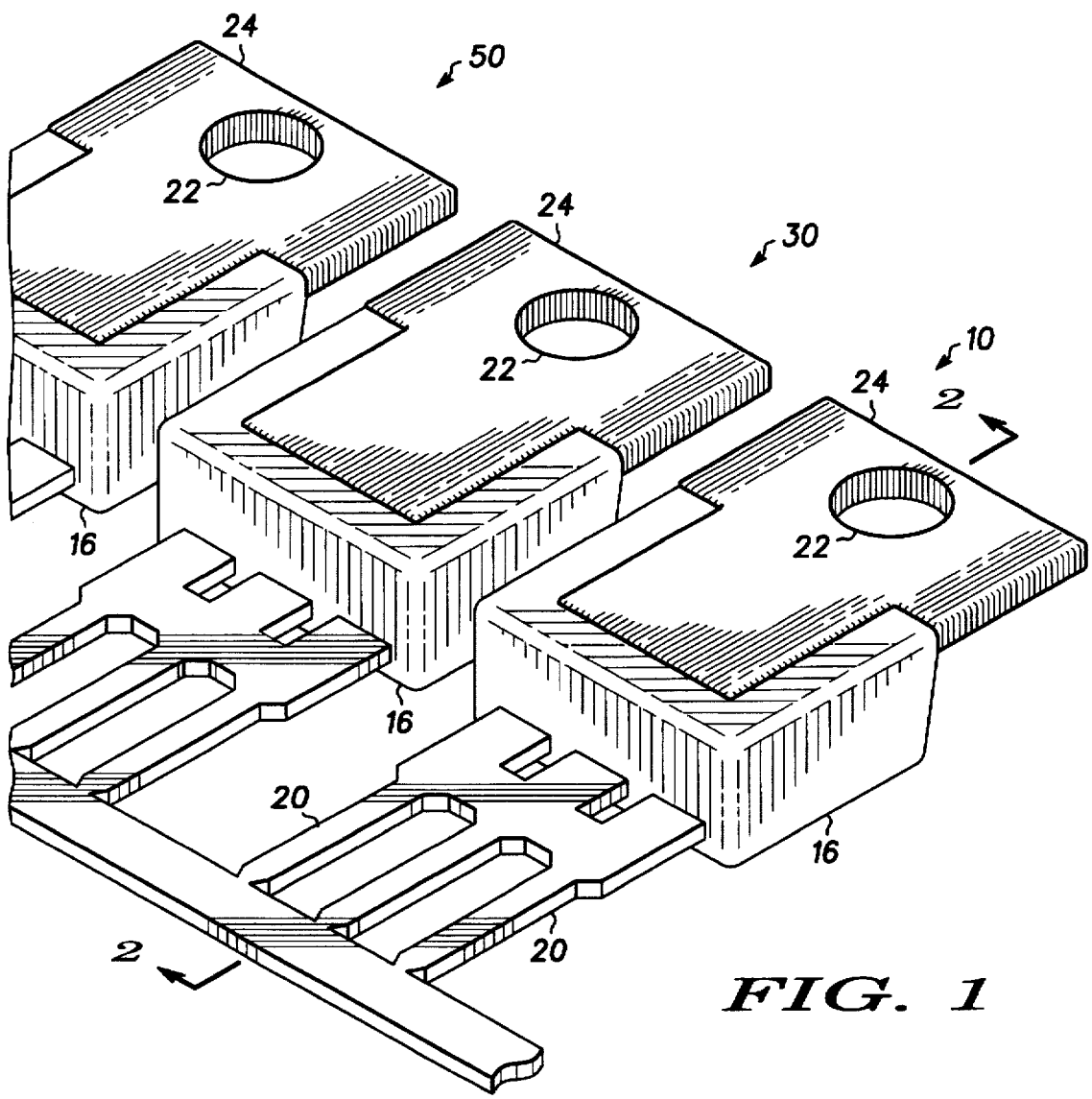
FIG. 1 illustrates an isometric view of semiconductor components during manufacturing in accordance with the present invention.
Figure 2:
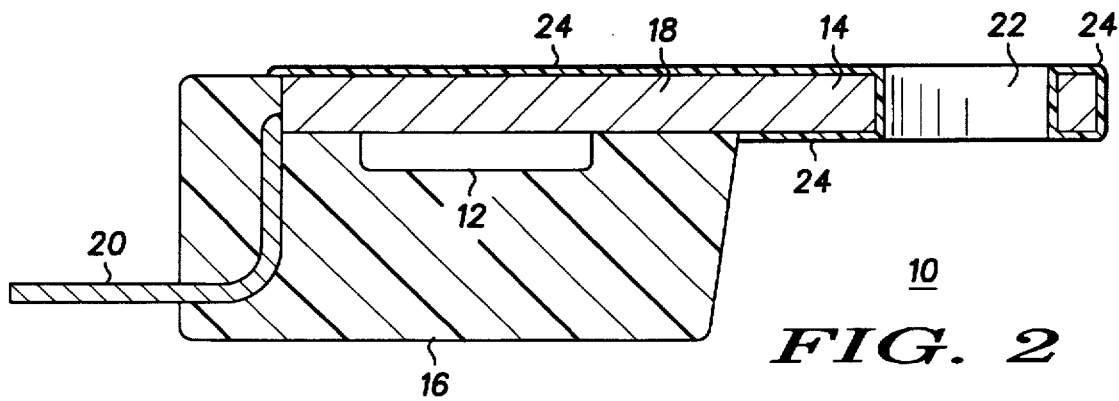
FIG. 2 illustrates a cross-sectional view of a semiconductor component of FIG. 1 taken along a section line 2—2.

FIG. 1 illustrates an isometric view of semiconductor components 10, 30, and 50 during manufacturing, and FIG. 2 illustrates a cross-sectional view of semiconductor component 10 of FIG. 1 taken along a section line 2—2. Components 30 and 50 are identical to component 10, and the same elements in FIGS. 1 and 2 are represented by the same element numbers. Component 10 includes a semiconductor chip or die 12, a copper-nickel alloy or other conventional metal leadframe 14, a mold compound or encapsulant 16 covering die 12 and portions of leadframe 14, and an organic resin or polyurethane coating 24. Leadframe 14 includes a heatsink 18 and leads 20, and heatsink 18 includes a mounting hole 22. In the preferred embodiment, coating 24 covers heatsink 18, including inside surfaces of hole 22. In an alternative embodiment, coating 24 also covers encapsulant 16.

In the preferred embodiment, component 10 is a discrete power device such as, for example, a power transistor or the like. However, in an alternative embodiment, component 10 can be any type of electronic component including, but not limited to, an integrated circuit, a multi-chip module, or a hybrid module. Die 12 supports a semiconductor device or circuit (not shown), which can be manufactured by conventional semiconductor processes. The semiconductor device or circuit is electrically coupled to leads 20 by wire bonding, flip-chip bonding, tape-automated bonding, or other appropriate electrical coupling techniques. The electrical coupling scheme is not shown in order to simplify FIG. 2. Die 12 can also be physically mounted onto heatsink 18 by using mounting techniques known in the art.

The prior art covers and electrically insulates a heatsink with a thermoplastic mold compound, which is more expensive than the industry standard mold compound. However, heatsink 18 does not have to be covered by a thermoplastic mold compound so the less expensive, industry standard mold compound can be used for encapsulant 16. In the preferred embodiment, coating 24 is formed on all surfaces of heatsink 18 not covered by encapsulant 16. Conventional grease, non-conductive pads, or insulated mounting screws are not needed when component 10 is installed onto a system board (not shown) because all surfaces of heatsink 18 are covered with coating 24. Therefore, coating 24 not only simplifies the assembly process of component 10, but reduces the cost of component 10 as well.

Coating 24 can be applied to portions of leadframe 14 by wet dipping, spraying, or rolling processes that chemically graft monomers or prepolymers and bond a polymeric organic film to surfaces of leadframe 14. The monomers and prepolymers are selected such that coating 24 provides both high voltage isolation and high thermal dissipation. In the preferred embodiment, the monomers/prepolymers are also selected to have approximately zero permeability to oxygen and water vapor in order to protect the covered portions of leadframe 14 from corrosion. The multi-functional monomers and prepolymers are preferably vinyl monomers and epoxy resins, which are capable of being chemically bonded to leadframe 14 through metal and other oxides. Specific examples of the preferred vinyl monomers and epoxy resins are disclosed hereinafter. In an alternative embodiment, the monomers and prepolymers are chemically grafted to both leadframe 14 and die 12.

The chemical grafting process used to apply coating 24 to portions of leadframe 14 is a method whereby a "foreign" material is attached to another material by a chemical bond. Chemical grafting can be visualized as the growth of "whiskers" onto a material wherein the whiskers are joined to leadframe 14 by means of a chemical bond. Coating 24, which uses the chemical bonds, is different from conventional semiconductor package coatings where the bond between a conventional coating and a metal substrate is only physical in nature and is not chemical in nature as it is for coating 24. By chemical grafting, a much higher degree of bonding permanency is achieved between coating 24 and leadframe 14 because the chemical bonds of the chemical grafting process are much stronger than the physical bonds of conventional processes. The graft-polymer or coating 24 cannot be leached from leadframe 14 because the linkage or bond between the coating 24 and leadframe 14 is covalent or chemical in nature Accordingly, because of the improved adhesion, coating 24 can be much thinner (e.g., less than 75 microns) than the prior art coatings, which are typically greater than 350 microns. The thinner coating 24 does not increase the probability of delamination compared to conventional coatings because of the improved adhesion of coating 24. Moreover, with the smaller thickness of coating 24, the thermal dissipation of component 10 is also improved. In an alternative embodiment, a thin layer of coating 24 covers all surfaces of heatsink 18, including the inner surfaces of hole 22, to electrically isolate heatsink 18 without significantly degrading the thermal dissipation efficiency of component 10 and without decreasing the reliability of component 10.

The method of chemically grafting coating 24 also differs from prior art methods of chemical grafting, which require radiation or high or low pH (the negative base 10 logarithm of a hydrogen ion or $-\log_{10}[H^+]$) values. The present method of chemical grafting does not use radiation and typically has a neutral pH value between approximately 5 and 8.

Chemical grafting involves the activation of leadframe 14, which is described in more detail hereinafter. Once leadframe 14 has been activated, chains of monomers linked by carbon-carbon bonds grow on leadframe 14 during the chemical grafting process. The chains of monomers produce the aforementioned whiskers that impart new, desirable, and permanent properties to coating 24 without degrading any of the existing desirable characteristics of coating 24. Improved moisture protection, voltage isolation, thermal dissipation, adhesion, and scratch and abrasion resistance are some of the permanent properties that are provided by the specific examples described hereinafter in Tables 1, 2, and 3.

An illustration of the activation method for the chemical grafting process of polypropylene can be represented as follows:

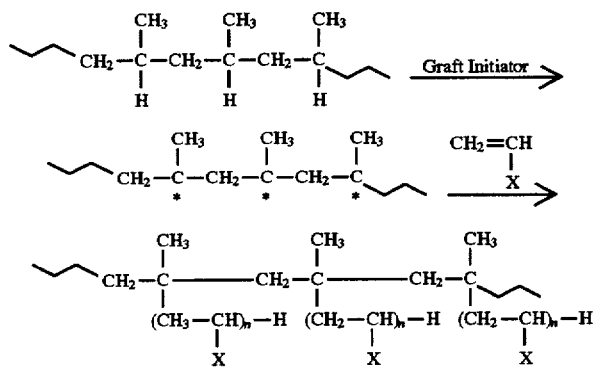

A graft initiator, which is described in more detail hereinafter, is used to remove active hydrogen atoms and concomitantly initiate the growth of polymer chains at the site from which the active hydrogen atoms were removed. The symbol "*" in the previous chemical formula represents a free radical produced by the graft initiator's removal of a hydrogen and one electron.

The

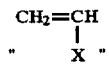

in the previous chemical equation represents a unit of a vinyl monomer, which is described in more detail hereinafter, where the side functional group "X" governs the desired properties of high moisture resistance, high voltage protection, and low thermal resistance. For example, when "X" includes nitrogen or phosphorous, coating 24 will be resistant to deformation at high temperatures. A mixture of monomers can be used in a given chemical reaction to produce a plurality of desired properties in one processing step.

The chemical grafting process grows polymer chains on the backbone chain of leadframe 14, and the length of the polymer chains in the aforementioned chemical equation can be controlled. The graft polymer chains are formed from vinyl monomers containing the desired properties of high voltage resistance and high thermal conductivity, among others. Examples of suitable vinyl monomers include, but are not limited to, hydroxyl groups, carboxyl groups, epoxy groups, amide groups, amine groups, and anhydride groups.

The reaction mechanism between the surface of leadframe 14 and die 12 and the monomers or prepolymers is not fully established, but it is believed that in the presence of moisture, there is a layer of oxide and hydroxyl groups tenaciously bound to die 12 and the metal of leadframe 14. The hydrogen of the hydroxyl groups can be removed by the graft initiator to form a free radical on leadframe 14 that reacts with the monomer or prepolymer, and this hydrogen removal activates leadframe 14 and begins the graft polymerization process. The oxides and hydroxyl groups react with the epoxy groups of the prepolymers or monomers and start a chemical reaction that also leads to a strong bonding between the organic polymer and the surface of leadframe 14.

Thus, the mechanism of graft polymerization can be represented by the following series of steps:

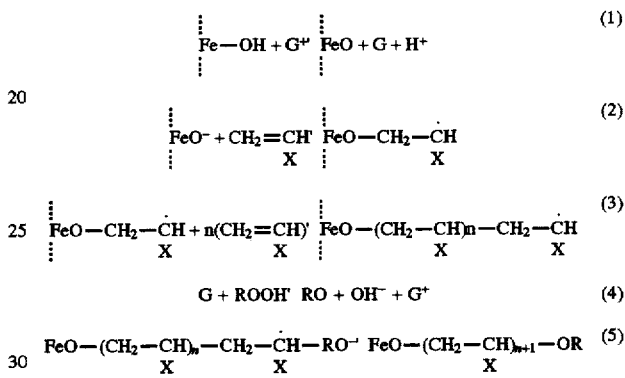

Equations (1), (2), (3), (4), and (5) represent radical formation or activation, graft initiation, propagation, regeneration of the graft initiator and free radical, and termination, respectively. The process of termination in equation (5) can be different when the chemical mixture contains reactive prepolymers or polymers, instead of monomers. In this alternative embodiment, the prepolymers can also undergo activation by the graft initiator giving reactive radicals "P" that react with the free radical on the surface of leadframe 14 to form a graft-polymer or coating 24 on leadframe 14. An example of this prepolymer reaction is:

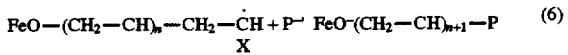

The graft initiator in equations (1) and (4) is comprised of, but is not limited to, the following metal ions: $Fe^{+++}/Fe^{++}$, $Ag^+$, $Co^{++}$, and $Cu^{++}$. The peroxide in equation (4) should be a catalyst such as, for example, benzoyl peroxide, methyl ethyl ketone peroxide, tertbutyl hydroperoxide, and hydrogen peroxide. The monomers and prepolymers in equations (2), (3), (5), and (6) have side functional groups identified by the symbol "X". The side functional groups can react between themselves and can also react with additional prepolymers or polymers included into the formulation to form a graft cross-linked organic coating. The side functional groups of the monomers and prepolymers should be comprised of, but are not limited to, hydroxyl groups, carboxyl groups, secondary and/or tertiary amino groups, and epoxy groups. The molecular ratio of the side functional groups to the reactive components should be adjusted so that no free radical groups are left after the reaction is finished.

The physical and chemical properties of the prepolymers and monomers included into the chemical mixture have been chosen to provide coating 24 with a black or blue color, a resistance to scratches and abrasions, a flame retardancy up to 175 degrees Celsius (°C.), a resistance to deformation during 100 temperature cycles between −65° C. and +150° C. with fifteen minutes at each extreme during each cycle, and a resistance to moisture when exposed to one-hundred percent humidity at a temperature of at least 121° C. for forty-eight hours.

In a TO-220 package, the prepolymers and monomers are chosen to provide a voltage isolation of approximately 4.5 kilovolts (kV) for 1 second with a leakage current of less than 50 microamperes. The prepolymers and monomers are also chosen to provide a heat dissipation value of approximately 2.2 degrees Celsius per watt (°C./watt).

In larger TO-264 and TO-2PBL packages, the prepolymers and monomers are also chosen to provide coating 24 with a voltage isolation of approximately 2.5 kV for 1 second with a leakage current of less than 50 microamperes. The prepolymers and monomers are also chosen to provide a heat dissipation value of approximately 0.5° C./watt in the larger packages.

For illustrative purposes only, Table 1 lists a set of ingredients that can be used to manufacture coating 24. The method of mixing the ingredients of Table 1 includes the following steps: (1) in the order indicated in Table 1, combine ingredients 1–9, the prepolymer (ingredient 10), and ingredients 11 and 12 in a container while stirring continuously, (2) mill the mixture for 48 hours, (3) in the order listed, mix ingredients 13–16 in a separate container to form a second mixture, (4) mix the prepolymer (ingredient 17) with the second mixture, (5) add ingredients 18 and 19 to the second mixture and stir to a uniform solution, (6) transfer the contents of the first mixture to the second mixture while milling, and (7) add ingredients 20 and 21 to the composite mixture.

TABLE 1

| INGREDIENTS | PARTS BY WEIGHT |
| --- | --- |
| 1. Isopropyl alcohol | 66.00 |
| 2. Ethylene glycol butyl ether | 84.00 |
| 3. Deionized water | 420.00 |
| 4. Silwet L-77 (surfactant) | 0.60 |
| 5. Silane A-187 | 9.00 |
| 6. Byk 341 (additive for improving leadframe wetting) | 3.00 |
| 7. Ethoxylated Trimethylolpropane Triacrylate SR9035 | 1.00 |
| 8. Amino methyl propanol AMP-95 (stabilizer) | 1.20 |
| 9. Dapro WD-28 (dispersing agent) | 1.10 |
| 10. Urethane Prepolymer NeoRez R-960 | 843.00 |
| 11. Cab-o-sil 610 (fumed silica) | 48.90 |
| 12. Potassium aluminum silicate Mica C-3000 | 588.00 |
| 13. Deionized water | 62.70 |
| 14. Byk 341 (wetting agent) | 0.20 |
| 15. Ethylene glycol butyl ether | 2.10 |
| 16. Dapro W95 HS (surfactant) | 1.20 |
| 17. Urethane prepolymer NeoRez R-960 | 126.00 |
| 18. Black color dispersion WD2350 | 85.00 |
| 19. Defoamer Nalco 2343 (anti-foaming agent) | 1.40 |
| 20. Hydrogen peroxide (0.1% solution by weight) | 0.01 |
| 21. Ferric ammonium sulfate (0.1% solution by weight) | 0.02 |

For illustrative purposes only, Table 2 lists another set of ingredients that can also be used to manufacture coating 24. The method of mixing the ingredients of Table 2 includes the following steps: (1) place ingredient 3 in a container, (2) add ingredients 4–9 and stir the contents to a uniform mixture, (3) add ingredients 1 and 2 and stir to a uniform mixture, (4) add the monomer (ingredient 15) and stir to a uniform solution, (5) add ingredients 16 and 17 and stir to a uniform mixture, (6) under agitation, add the prepolymer (ingredient 10), ingredient 11 in small increments, ingredient 12, ingredient 14, and then ingredient 13, (7) mill for 2–3 days, and (8) prior to applying the mixture to leadframe 14, make sure that the mixture has not settled and has no air bubbles.

TABLE 2

| INGREDIENTS | PARTS BY WEIGHT |
| --- | --- |
| 1. Isopropyl alcohol | 66.00 |
| 2. Ethylene glycol butyl ether | 84.00 |
| 3. Deionized water | 484.00 |
| 4. Dapro W95HS (surfactant) | 1.20 |
| 5. Dapro WD-28 (Dispersing agent) | 1.30 |
| 6. Silane A-187 | 8.00 |
| 7. Amino methyl propanol AMP-95 (stabilizer) | 1.00 |
| 8. Byk 341 | 3.00 |
| 9. Silwet L-77 (surfactant) | 0.50 |
| 10. Urethane prepolymer NeoRez R-960 | 969.00 |
| 11. Cab-O-Sil 610 (fumed silica) | 48.00 |
| 12. Potassium aluminum silicate Mica C-3000 | 588.00 |
| 13. Black color dispersion WD-2350 | 81.00 |
| 14. Defoamer Nalco 2343 (anti-foaming agent) | 1.20 |
| 15. Polyethylene glycol diacrylate SR344 | 1.00 |
| 16. Hydrogen peroxide (0.1% solution by weight) | 0.01 |
| 17. Ferric ammonium sulfate (0.1% solution by weight) | 0.01 |

For illustrative purposes only, Table 3 lists yet another a set of ingredients that can also be used to manufacture coating 24. The method of mixing the ingredients of Table 3 includes the following steps: (1) place ingredient 3 in a container, (2) add the additives (ingredients 4–9) and stir the contents to a uniform mixture, (3) add ingredients 1 and 2 and stir to a uniform mixture, (4) add the monomers (ingredients 15 and 16) and stir to a uniform solution, (5) add ingredients 17 and 18 and stir to a uniform mixture, (6) under agitation, add the prepolymer (ingredient 10), ingredient 11 in small increments, ingredient 12, ingredient 14, and then ingredient 13, and (7) mill for 2–3 days.

TABLE 3

| INGREDIENTS | PARTS BY WEIGHT |
| --- | --- |
| 1. Isopropyl alcohol | 66.00 |
| 2. Ethylene glycol butyl ether | 87.00 |
| 3. Deionized water | 500.00 |
| 4. Dapro W95 HS (surfactant) | 1.10 |
| 5. Silwet L-77 (surfactant) | 0.60 |
| 6. Dapro WD-28 (dispersing agent) | 1.10 |
| 7. Silane A-187 | 9.00 |
| 8. Amino methyl propanol AMP-95 (stabilizer) | 1.50 |
| 9. Byk 341 | 3.00 |
| 10. Urethane Prepolymer NeoRez R-960 | 995.00 |
| 11. Cab-O-Sil 610 (fumed silica) | 48.00 |
| 12. Potassium aluminum silicate Mica C-3000 | 588.00 |
| 13. Black color dispersion WD 2350 | 85.00 |
| 14. Defoamer Nalco 2343 (anti-foaming agent) | 1.40 |
| 15. Ethoxylated trimethylol propane Triacrylate SR9035 | 0.50 |
| 16. Polyethylene glycol diacrylate SR344 | 0.50 |

TABLE 3-continued

| INGREDIENTS | PARTS BY WEIGHT |
| --- | --- |
| 17. Hydrogen peroxide (0.1% solution by weight) | 0.01 |
| 18. Ferric ammonium sulfate (0.1% solution by weight) | 0.02 |

Therefore, in accordance with the present invention, it is apparent there has been provided an improved coating for semiconductor components that overcomes the disadvantages of the prior art. The coating improves the voltage isolation and thermal dissipation of prior art TO-220, TO-264, and other semiconductor fullpak packages. The coating also has stronger adhesion to the leadframe to reduce the problem of delamination, and the coating also has improved moisture protection to reduce the problem of corrosion.

We claim:

1. A method of manufacturing a semiconductor component comprising:
   providing a metal substrate;
   providing a resin comprising:
      providing a monomer having a side functional group;
      providing a graft initiator; and
      providing a peroxide;
   and
   grafting the resin to the metal substrate.

2. The method of claim 1 wherein the step of providing the resin further comprises selecting the vinyl monomer from the group consisting of hydroxyl groups, carboxyl groups, epoxy groups, amide groups, amine groups, and anhydride groups.

3. The method of claim 1 wherein the step of providing the resin further comprises selecting the graft initiator from the group consisting of $Fe^{+++}/Fe^{++}$, $Ag^+$, $Co^{++}$, and $Cu^{++}$.

4. The method of claim 1 wherein the step of providing the resin further comprises selecting the peroxide from the group consisting of benzoyl peroxide, methyl ethyl ketone peroxide, tertbutyl hydroperoxide, and hydrogen peroxide.

5. The method of claim 1 wherein the step of providing the resin further comprises selecting the side functional groups from the group consisting of hydroxyl groups, carboxyl groups, secondary amino groups, tertiary amino groups, and epoxy groups.

6. A method of manufacturing an electronic component comprising:
   providing a leadframe and a semiconductor die;
   coupling the semiconductor die to the leadframe;
   providing an organic resin comprising:
      providing a vinyl monomer;
      providing a graft initiator; and
      providing a peroxide;
   and
   chemically grafting the organic resin to the leadframe.

7. The method of claim 6 wherein the step of providing the organic resin further comprises selecting the vinyl monomer from the group consisting of hydroxyl groups, carboxyl groups, epoxy groups, amide groups, amine groups, and anhydride groups.

8. The method of claim 7 wherein the step of providing the organic resin further comprises selecting the graft initiator from the group consisting of $Fe^{+++}/Fe^{++}$, $Ag^+$, $Co^{++}$, and $Cu^{++}$.

9. The method of claim 8 wherein the step of providing the organic resin further comprises selecting the peroxide from the group consisting of benzoyl peroxide, methyl ethyl ketone peroxide, tertbutyl hydroperoxide, and hydrogen peroxide.

10. The method of claim 9 wherein the step of providing the organic resin further comprises selecting the side functional groups from the group consisting of hydroxyl groups, carboxyl groups, secondary amino groups, tertiary amino groups, and epoxy groups.

11. The method of claim 6 further comprising covering the leadframe and the semiconductor die with a mold compound wherein the step of chemically grafting the organic resin includes chemically grafting the organic resin to the mold compound.

12. The method of claim 6 wherein the step of chemically grafting the organic resin includes wet dipping the organic resin.

13. The method of claim 6 wherein the step of chemically grafting the organic resin includes spraying the organic resin.

14. The method of claim 6 wherein the step of chemically grafting the organic resin includes rolling the organic resin.

15. A method of manufacturing an electronic component comprising:
   providing a leadframe;
   providing a semiconductor chip;
   mounting the semiconductor chip onto the leadframe;
   providing a polymeric organic coating comprising:
      providing isopropyl alcohol;
      providing ethylene glycol butyl ether;
      providing deionized water;
      providing potassium aluminum silicate;
      providing ferric ammonium sulfate;
      providing a vinyl monomer;
      providing a graft initiator; and
      providing a peroxide;
   and
   chemically grafting the polymeric organic coating to the leadframe.

16. The method of claim 15 wherein the step of providing the polymeric organic coating includes providing urethane prepolymer for the vinyl monomer.

17. The method of claim 15 wherein the step of providing the polymeric organic coating includes providing polyethylene glycol diacrylate for the vinyl monomer.

18. The method of claim 15 wherein the step of providing the polymeric organic coating further includes providing ethoxylated trimethylol propane triacrylate for the vinyl monomer.

19. The method of claim 15 further comprising covering the leadframe and the semiconductor chip with an encapsulant wherein the step of chemically grafting the polymeric organic coating includes chemically grafting the polymeric organic coating to the semiconductor chip.

* * * * *